US 11,313,921 B2

(12) United States Patent
Dai et al.

(10) Patent No.: US 11,313,921 B2
(45) Date of Patent: Apr. 26, 2022

(54) MAGNETIC FIELD MEASUREMENT DEVICE AND MAGNETIC FIELD MEASUREMENT METHOD BASED ON SOLID-STATE SPINS

(71) Applicant: University of Science and Technology of China, Hefei (CN)

(72) Inventors: Yingqiu Dai, Anhui (CN); Yunbin Zhu, Anhui (CN); Xing Rong, Anhui (CN); Jiangfeng Du, Anhui (CN)

(73) Assignee: University of Science and Technology of China, Hefei (CN)

( * ) Notice: Subject to any disclaimer, the term of this patent is extended or adjusted under 35 U.S.C. 154(b) by 0 days.

(21) Appl. No.: 16/960,585

(22) PCT Filed: Jun. 20, 2018

(86) PCT No.: PCT/CN2018/091971
§ 371 (c)(1),
(2) Date: Jul. 8, 2020

(87) PCT Pub. No.: WO2019/223052
PCT Pub. Date: Nov. 28, 2019

(65) Prior Publication Data
US 2020/0393522 A1 Dec. 17, 2020

(30) Foreign Application Priority Data
May 25, 2018 (CN) .......................... 201810546040.4

(51) Int. Cl.
*G01R 33/032* (2006.01)
(52) U.S. Cl.
CPC ................. *G01R 33/032* (2013.01)

(58) Field of Classification Search
None
See application file for complete search history.

(56) References Cited

U.S. PATENT DOCUMENTS 8,547,090 B2 10/2013 Lukin et al.
8,947,080 B2 2/2015 Lukin et al.
(Continued)

FOREIGN PATENT DOCUMENTS

CN    104360152 A    2/2015
CN    105158709 A    12/2015
(Continued)

OTHER PUBLICATIONS

PCT/CN2018/091971, Feb. 27, 2019, International Search Report and Written Opinion.
(Continued)

*Primary Examiner* — Jas A Sanghera
(74) *Attorney, Agent, or Firm* — Wolf, Greenfield & Sacks, P.C.

(57) ABSTRACT

A magnetic field measurement device and a magnetic field measurement method based on solid-state spins are provided. Zeeman splitting between electron energy levels of electrons of a magnetic sensitive unit is different under the action of external magnetic fields having different intensities. Continuous excitation and manipulation is applied to the electrons by means of a control field and control laser, so that spins of a system can reach a balanced state. The spin population of the system is influenced by the external magnetic fields. Therefore, fluorescence signals with intensities changing with the spin population of the system can be obtained, and fluorescent signals having different intensities can be obtained according to the different intensities of the external magnetic fields.

18 Claims, 3 Drawing Sheets

(56) References Cited

U.S. PATENT DOCUMENTS

| | | | | |
|---|---|---|---|---|
| 2015/0235661 A1* | 8/2015 | Heidmann | ............. | G01N 24/08 |
| | | | | 324/304 |
| 2016/0146904 A1* | 5/2016 | Stetson, Jr. | .......... | G01R 35/005 |
| | | | | 324/202 |
| 2017/0328965 A1 | 11/2017 | Hruby et al. | | |
| 2020/0025835 A1* | 1/2020 | Pham | ................. | G01R 33/0017 |

FOREIGN PATENT DOCUMENTS

| | | |
|---|---|---|
| CN | 107131875 A | 9/2017 |
| CN | 107271456 A | 10/2017 |
| CN | 107356820 A | 11/2017 |
| CN | 105158709 B | 12/2017 |
| CN | 107449758 A | 12/2017 |
| WO | WO 2017/127090 | 7/2017 |

OTHER PUBLICATIONS

International Search Report and Written Opinion for International Application No. PCT/CN2018/091971, dated Feb. 27, 2019.

* cited by examiner

```
┌─────────────────────────────────────┐
│ providing a static magnetic field of a set intensity for the │
│ measuring component by the static magnetic field │
│ module, wherein the magneto-sensitive unit undergoes │ ～ S11
│ Zeeman splitting │
└─────────────────────────────────────┘
                  │
                  ▼
┌─────────────────────────────────────┐
│ operating the manipulating module and the light source │
│ to provide a manipulating field and a manipulating laser │
│ for the measuring component 4, and continuously │ ～ S12
│ exciting and manipulating the magneto-sensitive unit │
└─────────────────────────────────────┘
                  │
                  ▼
┌─────────────────────────────────────┐
│ placing the measuring component in the magnetic field │
│ to be measured, keeping the manipulating field, the │
│ manipulating laser, and the static magnetic field │
│ unchanged, and causing the magneto-sensitive unit to │ ～ S13
│ emit a fluorescence signal in another equilibrium state │
└─────────────────────────────────────┘
                  │
                  ▼
┌─────────────────────────────────────┐
│ converting the changed fluorescence signal into an │
│ electric signal by the detection module, and measuring │
│ the magnetic field to be measured based on the electric │
│ signal │ ～ S14
└─────────────────────────────────────┘
```

Figure 3

MAGNETIC FIELD MEASUREMENT DEVICE AND MAGNETIC FIELD MEASUREMENT METHOD BASED ON SOLID-STATE SPINS

The present application is a National Phase entry of PCT Application No. PCT/CN2018/091971, filed on Jun. 20, 2018, which claims the priority to Chinese Patent Application No. 201810546040.4, titled "MAGNETIC FIELD MEASUREMENT APPARATUS AND MAGNETIC FIELD MEASUREMENT METHOD BASED ON SOLID-STATE SPINS", filed with the China National Intellectual Property Administration on May 25, 2018. The contents of each of these applications are incorporated herein by reference in their entirety.

FIELD

The present application relates to the technical field of magnetic field measurement, and in particular to a magnetic field measurement apparatus and a magnetic field measurement method based on solid-state spin.

BACKGROUND

Magnetic field measurement is widely used in various fields such as earth and space physics, military technology, biology and medicine, and industry, which plays an important role and has become an indispensable measurement method in modern times. At present, there are various types of sensors used for magnetic field measurement, including a fluxgate sensor, a search-coil sensor, a Hall sensor, a magnetoresistance sensor, a giant magneto-impedance magnetic sensor, a superconducting quantum interference device (SQUID), and a magnetic sensor based on solid-state spin, and the like.

In recent years, a quantum information processing method based on solid-state spin has been rapidly developed, which brings new technology innovation and promotes the technology development of a solid-state spin sensor. The solid-state spin sensor has high spatial resolution, high sensitivity, good expandability and is easy to control. Thus, a solid-state spin system has become hot spots for people to study.

An electron has a spin magnetic moment. An energy level of the electron will split in an external magnetic field, that is, one energy level will split into several magnetic sublevels, which is called Zeeman splitting. When the electron transitions between different energy levels, the electron must comply with the transition selection rule, and this rule is related to the respective quantum numbers of the two energy levels. Therefore, whether the electron can transition between different energy levels depends on the spin state of the electron.

An existing solid-state spin magnetic sensor uses a pulsed method to measure the magnetic field. When electrons spin in a superposition state, a relative phase will be superposed to different basis vectors due to the external magnetic field. Therefore, the system is firstly prepared to a superposition state, and then is allowed to evolve freely under the external magnetic field or is controlled to evolve by a laser or a microwave pulse sequence, and at this time a relative phase is superposed to the superposition state of the system. Finally, the relative phase is mapped to a population, and a signal is read out to obtain the information of the magnetic field.

Because the readout signal intensity changes periodically with the relative phase, the measurement can be performed only within in a certain relative phase range. The relative phase is effected by the intensity of the external magnetic field and the measurement time, and the measurement time is limited by the relaxation time of the system, thus, the intensity of the external magnetic field that can be measured cannot reach a large range due to the limitation of the relaxation time of the system, and the dynamic range of this measurement method is low.

In addition, the existing pulsed magnetic sensor based on solid-state spin mainly has two measurement modes: a DC measurement mode and an AC measurement mode. The DC measurement mode is a signal measurement in the time domain, which is limited by the sampling rate and the response time of the signal conversion of the system and has an upper limit for frequency measurement (generally not exceeding 100 Hz), that is, the frequency that can be measured is not greater than 100 Hz. Besides, due to other reasons such as the nature of solid-state spin (such as the relaxation time of the system), the AC measurement mode has a lower limit of frequency measurement (generally kHz), that is, the frequency range that can be measured is not less than 1 KHz. Therefore, a magnetic field in the frequency range (100 Hz-1 KHz) between the upper and lower limits of the two measurement modes cannot be directly measured.

Since the magnetic field in the frequency range that cannot be measured by the existing measurement modes plays an important role in geomagnetic field measurement and bio-magnetic field monitoring, an urgent problem to be solved in the field of magnetic field measurement is how to provide a magnetic field measurement apparatus with a wide frequency range.

SUMMARY

In order to solve the above problem, a magnetic field measurement apparatus and a magnetic field measurement method based on solid-state spin are provided according to the technical solutions of the present application, and the magnetic field measurement apparatus has a wide frequency measurement range.

In order to achieve the above objects, the following technical solutions are provided according to the present application.

A magnetic field measurement apparatus based on solid-state spin, which includes:
a measuring component, which includes a magneto-sensitive unit based on solid-state spin;
a light source module, which is configured to emit a manipulating laser that irradiates the measuring component;
a manipulating module, which is configured to provide a manipulating field for the measuring component;
a static magnetic field module, which is configured to provide a set static magnetic field for the measuring component; and
a detection module, which is configured to acquire a fluorescence signal emitted by the measuring component under actions of the magnetic field to be measured, the manipulating laser, the manipulating field, and the static magnetic field, and measure the magnetic field to be measured based on the fluorescence signal.

Preferably, in the magnetic field measurement apparatus, the measuring component is a diamond block having an NV color center, and the NV color center is the magneto-sensitive unit.

Preferably, in the magnetic field measurement apparatus, the light source module includes a light source and an optical unit, and an optical signal emitted by the light source is processed by the optical unit to form the manipulating laser.

Preferably, in the magnetic field measurement apparatus, the light source is a laser device, and a wavelength of the laser emitted by the laser device is 532 nm;

and the optical unit is configured to collimate and focus the laser emitted by the laser device to form the manipulating laser and configured to allow the manipulating laser to irradiate a preset position of the measuring component.

Preferably, in the magnetic field measurement apparatus, the manipulating module includes a manipulating source and a microstrip antenna connected to the manipulating source;

where the manipulating source is configured to drive the microstrip antenna to form the manipulating field.

Preferably, in the above magnetic field measurement apparatus, the manipulating source is a microwave source configured to allow the microstrip antenna to form a microwave field, and the microwave field is the manipulating field.

Preferably, in the magnetic field measurement apparatus, the static magnetic field module includes a static magnetic field device and a power source;

where the power source is configured to drive the static magnetic field device to form the static magnetic field.

Preferably, in the magnetic field measurement apparatus, the static magnetic field device is a static magnetic field coil.

Preferably, in the magnetic field measurement apparatus, the detection module includes a signal receiving-conversion unit and a measuring unit;

when the magnetic field to be measured is measured, the fluorescence signal emitted by the magneto-sensitive unit enters the signal receiving-conversion unit, and the signal receiving-conversion unit is configured to convert the fluorescence signal into an electric signal; and the measuring unit is configured to measure the magnetic field to be measured based on the electrical signal.

A magnetic field measurement method based on solid-state spin is further provided according to the present application, which is applied to the magnetic field measurement apparatus according to any one of the above aspects. The magnetic field measurement method includes:

providing a static magnetic field of a set intensity for the measuring component by the static magnetic field module, so that the magneto-sensitive unit undergoes Zeeman splitting;

operating the manipulating module and the light source to provide a manipulating field and a manipulating laser for the measuring component, and continuously exciting and manipulating the magneto-sensitive unit, wherein the manipulating field allows the magneto-sensitive unit to transition between spin energy levels, the manipulating laser allows the magneto-sensitive unit to transition between the ground state and the excited state, and the fluorescence signal of which the intensity is related to the spin population of the system is emitted after the spin system reaches an equilibrium state under the joint action of the manipulating field and the manipulating laser;

placing the measuring component in a magnetic field to be measured, and keeping the manipulating field, the manipulating laser, and the static magnetic field unchanged, wherein a Zeeman splitting energy-level difference of the magneto-sensitive unit is changed under the action of the magnetic field to be measured, and under the action of the manipulating field and the manipulating laser, the spin system reaches another equilibrium state, the spin population of the system is changed, the emitted fluorescence signal is changed, and the changed fluorescence signal contains measurement parameters of the magnetic field to be measured; and converting the changed fluorescence signal into an electric signal by the detection module, and measuring the magnetic field to be measured based on the electric signal.

It can be known from the above description that, in the magnetic field measurement apparatus and magnetic field measurement method based on solid-state spin provided by the technical solutions of the present application, the effects of Zeeman splitting between the energy levels of the electron are different while the electrons of the magneto-sensitive unit are under external magnetic fields of different intensities, the spin of the system can reach an equilibrium state by manipulating such as continuously exciting the electrons by the manipulating field and the manipulating laser, and the spin population of the system is affected by the external magnetic field. Thus, a fluorescence signal of which the intensity varies with the spin population of the system can be obtained. Depending on the intensity of the external magnetic field, fluorescence signals of different intensities can be obtained. According to the technical solutions of the present application, the measurement is performed in the equilibrium state, which is a kind of steady state measurement, is not limited by the relaxation time of the system, can greatly increase the frequency range of the magnetic field measurement, and has a relatively wide dynamic range.

BRIEF DESCRIPTION OF THE DRAWINGS

For more clearly illustrating embodiments of the present application or the technical solutions in the conventional technology, drawings referred to for describing the embodiments or the conventional technology will be briefly described hereinafter. The drawings in the following description are only examples of the present application, and for those of ordinary skill in the art, other drawings may be obtained based on the provided drawings without any creative efforts.

FIG. 3 is a schematic flowchart of a magnetic field measurement method according to an embodiment of the present application.

DETAILED DESCRIPTION OF THE EMBODIMENTS

Figure 1:
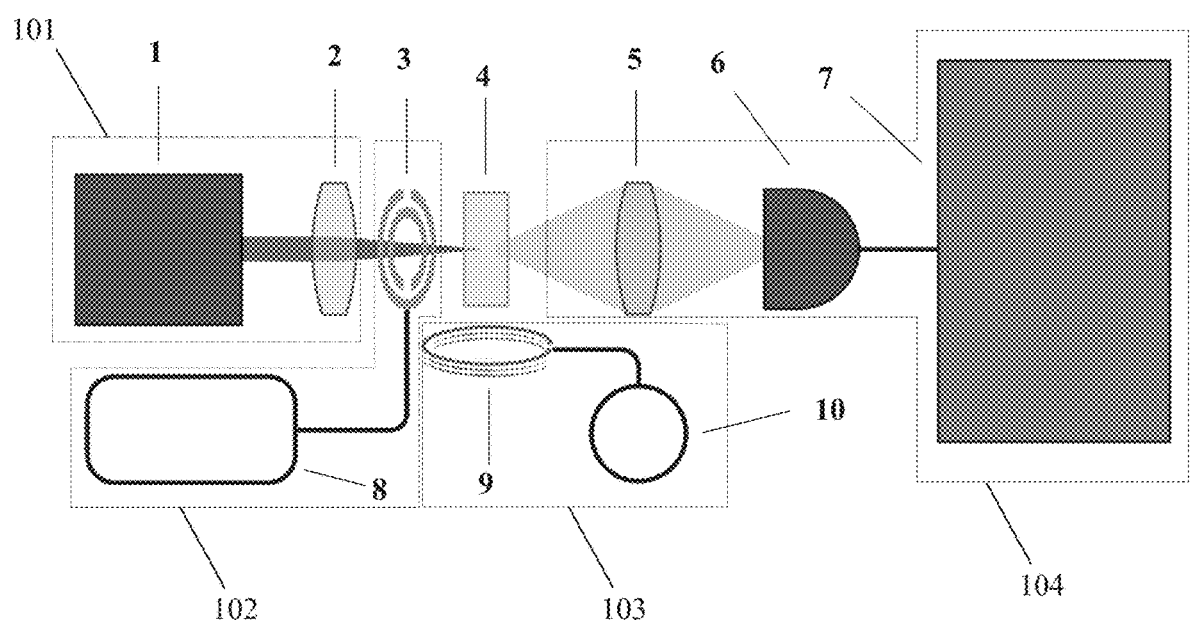
FIG. 1 is a schematic structural diagram of a magnetic field measurement apparatus based on solid-state spin according to an embodiment of the present application.

The technical solutions according to the embodiments of the present application will be described clearly and completely in the following in conjunction with the drawings in the embodiments of the present application. It is apparent that the described embodiments are only a part of the embodiments according to the present application, rather than all the embodiments. Any other embodiments obtained by those skilled in the art based on the embodiments of the present application without any creative efforts fall within the protection scope of the present application.

As described in the background, there are two conventional measurement modes for the pulsed magnetic sensor based on solid-state spin, the DC measurement mode is a signal measurement in the time domain, which is limited by the sampling rate and the response time of the signal conversion of the system and has an upper limit for frequency measurement (generally not exceeding 100 Hz), and due to other reasons such as the nature of solid-state spin (such as the relaxation time of the system), the AC measurement mode has a lower limit of frequency measurement (generally kHz). Therefore, a magnetic field in a frequency range between the upper and lower limits of the two measurement modes cannot be directly measured. Since the magnetic field in the frequency range that cannot be measured by the existing measurement modes plays an important role in geomagnetic field measurement and bio-magnetic field monitoring, an urgent problem to be solved in the field of magnetic field measurement is how to provide a magnetic field measurement apparatus with a wide frequency range.

According to the research of the inventors, it has been found that, the effects of Zeeman splitting between the energy levels of the electron are different while the spin magnetic moment of the electron of the magneto-sensitive unit based on solid-state spin is under external magnetic fields of different intensities. The spin of the system can reach an equilibrium state by manipulating such as continuously exciting the electrons by the manipulating field and the manipulating laser, and the spin population of the system is affected by the intensity of the external magnetic field. Thus, a fluorescence signal of which the intensity varies with the spin population can be obtained. Therefore, fluorescence signals of different intensities including measurement parameters of the magnetic field can be obtained according to different intensities of the external magnetic field. The spin system is measured in the equilibrium state. The measurement is a kind of steady state measurement, which is not limited by the relaxation time of the system, and greatly increases the frequency range.

Based on the above research, a magnetic field measurement apparatus is provided according to an embodiment of the present application, which includes:

a measuring component, which includes a magneto-sensitive unit based on solid-state spin;

a light source module, which is configured to emit a manipulating laser that irradiates the measuring component;

a manipulating module, which is configured to provide a manipulating field for the measuring component;

a static magnetic field module, which is configured to provide a set static magnetic field for the measuring component; and a detection module, which is configured to acquire a fluorescent signal emitted by the measuring component under actions of the magnetic field to be measured, the regulating laser, the regulating field, and the static magnetic field, and measure the magnetic field to be measured based on the fluorescent signal.

The above is the core idea of the technical solutions of the present application. In order to make the objectives, features and advantages of the present application more apparent and comprehensible, the present application will be described in detail in the following in conjunction with the drawings and the specific embodiments.

Referring to FIG. 1, FIG. 1 is a schematic structural diagram of the magnetic field measurement apparatus based on solid-state spin according to an embodiment of the present application. The magnetic field measurement apparatus includes a measuring component 4, which includes a magneto-sensitive unit based on solid-state spin; a light source module 101, which is configured to emit a manipulating laser that irradiates the measuring component 4; a manipulating module 102, which is configured to provide a manipulating field for the measuring component 4; a static magnetic field module 103, which is configured to provide a set static magnetic field for the measuring component 4; and a detection module 104, which is configured to acquire a fluorescence signal emitted by the measuring component 4 under actions of a magnetic field to be measured, the manipulating laser, the manipulating field, and the static magnetic field, and measure the magnetic field to be measured based on the fluorescence signal.

The effects of Zeeman splitting between the energy levels of the electron are different when the electron of the magneto-sensitive unit is under external magnetic fields of different intensities. The spin of the system may reach an equilibrium state by continuously exciting and manipulating the electrons by the manipulating field and the manipulating laser, and the spin population of the system is effected by the external magnetic field. Thus, a fluorescence signal of which the intensity varies with the spin population of the system can be obtained. Depending on the intensity of the external magnetic field, fluorescence signals of different intensities may be obtained. According to the technical solutions of the present application, the measurement is performed in the equilibrium state, which is a kind of steady state measurement, is not limited by the relaxation time of the system, can greatly increase the frequency range of the magnetic field measurement, and has a relatively wide dynamic range.

Optionally, the measuring component 4 is a diamond block having an NV color center (nitrogen-vacancy defect), and the NV color center is the magneto-sensitive unit. A diamond substrate may be used. By performing ion implantation on the diamond substrate and annealing in a vacuum environment, an NV color center is formed in the diamond substrate. Specifically, a commercial high-purity diamond is used as the substrate, and is annealed at a set temperature, forming a certain concentration of the NV color center in the diamond for measuring magnetic fields. The NV color center is composed of nitrogen defects and adjacent vacancies. A distance between a nitrogen defect and an adjacent vacancy is a length of the C—C bond in the diamond, and the bond length thereof is very small. When a magnetic field is measured through the NV color center, the NV color center has extremely high spatial resolution and detection sensitivity.

The unpaired electrons of the NV color center form a spin triplet-single state system. The energy level difference between a ground state of the triplet state $^3E$ and a first excited state A is 1.945 eV, and the corresponding zero phonon line is 637 nm. Therefore, when a laser with energy of 1.945 eV or more is used to excite the NV color center, the NV color center will be excited, and the electrons will have a great probability to transition between the ground state $^3E$ and the first excited state $^3A$, and then emit fluorescence photons to form fluorescence. When the electron spins in the state $m_s=\pm1$, the electron will have a greater probability to transition through the state $^3A$ to the ground state $m_s=0$, and no photons will be emitted. Based on this principle, the NV color center may be used to measure external magnetic fields.

As shown in FIG. 1, the light source module 101 includes: a light source 1 and an optical unit 2, and an optical signal emitted by the light source 1 is processed by the optical unit 2 to form the manipulating laser. Specifically, the light source 1 is a laser device, and a wavelength of the laser emitted by the laser device is 532 nm; and the optical unit 2 is configured to collimate and focus the laser emitted by the laser device 1 to form the manipulating laser and configured to allow the manipulating laser to irradiate a preset position of the measuring component 4. The optical unit includes an optical element such as a lens, so as to facilitate collimation and focusing of the laser emitted by the laser device 1.

As shown in FIG. 1, the manipulating module 102 includes: a manipulating source 8 and a microstrip antenna 3 connected to the manipulating source 8; in which the manipulating source 8 is configured to drive the microstrip antenna 3 to form the manipulating field. The measuring component 4 may be fixed to the microstrip antenna 3. Specifically, the manipulating source 8 is a microwave source configured to allow the microstrip antenna to form a microwave field, and the microwave field is the manipulating field, that is, the manipulating field is a magnetic field. The microstrip antenna 3 is connected to the manipulating source 8 through a high-frequency terminal.

As shown in FIG. 1, the static magnetic field module 103 includes: a static magnetic field device 9 and a power source 10; in which the power source 10 is configured to drive the static magnetic field device 9 to form the static magnetic field. Specifically, the static magnetic field device 9 is a static magnetic field coil. The static magnetic field device 9 is located outside the measuring component 4 and is connected to the power source 10.

As shown in FIG. 1, the detection module 104 includes: a signal receiving-conversion unit 6 and a measuring unit 7; when the magnetic field to be measured is measured, the fluorescence signal emitted by the magneto-sensitive unit enters the signal receiving-conversion unit 6, and the signal receiving-conversion unit 6 is configured to convert the fluorescence signal into an electric signal; and the measuring unit 7 is configured to measure the magnetic field to be measured based on the electrical signal. Optionally, the detection module 104 further includes a lens 5, and the lens 5 is arranged between the measuring component 4 and the receiving-conversion unit 6. In this situation, the fluorescence signal emitted by the magneto-sensitive unit enters the signal receiving-conversion unit 6 through the lens 5.

Optionally, the signal receiving-conversion unit 6 may be a photodiode. In a case that the photodiode works under a reverse voltage, the photocurrent generated by the photodiode changes with the applied light intensity. The measuring unit 7 may be a lock-in amplifier or a spectrum analyzer. In this case, the measuring unit 7 measures the magnetic field to be measured in the frequency domain. In other cases, the measuring unit 7 may be an oscilloscope. In this case, the measuring unit measures the magnetic field to be measured in the time domain.

In the embodiment of the present application, a lock-in amplifier is used as the measuring unit 7. The lock-in amplifier outputs a DC voltage proportional to the signal amplitude of the reference signal frequency in the input signal according to the cross-correlation detection principle of an input signal and a reference signal. Other frequency components in the input signal will not make any contribution to the output voltage.

When the magnetic field to be measured is measured, after the magnetic field to be measured is applied to the measuring component 4, the magneto-sensitive unit will emit a fluorescence signal including measurement parameters of the magnetic field to be measured under the action of the manipulating field and the manipulating laser, and the signal receiving-conversion unit 6 acquires the fluorescence signal through the lens 5 and converts the fluorescence signal into an electrical signal that is convenient for the measuring unit 7 to directly measure, so that the measuring unit 7 calculates the magnetic induction and the frequency of the magnetic field to be measured based on the electrical signal, thereby completing the measurement of the magnetic field to be measured. It should be noted that the measurement of the magnetic field to be measured includes, but is not limited to, measuring the magnetic induction and the frequency of the magnetic field to be measured.

The working principle of the magnetic field measurement apparatus according to the embodiments of the present application is that, the effects of Zeeman splitting between the energy levels of the electron are different while the spin magnetic moment of the electron of the magneto-sensitive unit based on solid-state spin is under external magnetic fields of different intensities. In the embodiments of the present application, the manipulating field, the static magnetic field, and the magnetic field to be measured all belong to external magnetic fields. The spin of the system may reach an equilibrium state by manipulating such as continuously exciting the electrons by the manipulating field and the manipulating laser, and the spin population of the system is effected by the intensity of the external magnetic field. Thus, a fluorescence signal of which the intensity varies with the spin population may be obtained. Therefore, fluorescence signals of different intensities can be obtained according to different intensities of the external magnetic field. According to the technical solutions of the present application, the spin system is measured in the equilibrium state, and the measurement is a kind of steady state measurement, which is thereby not limited by the relaxation time of the system and has a relatively wide frequency range.

Figure 2:
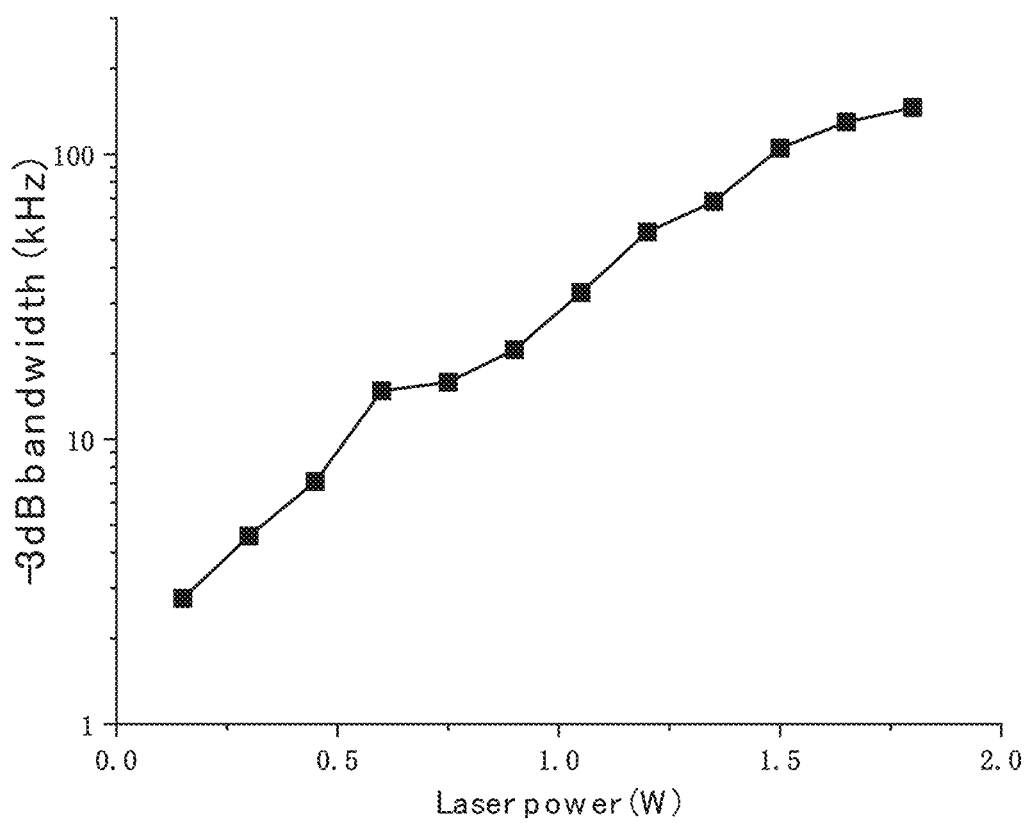
FIG. 2 is a curve chart of a measurement bandwidth of the magnetic field measurement apparatus according to an embodiment of the present application.

The magnetic field measurement apparatus according to the embodiments of the present application can solve the problems of the low dynamic range and the inability to measure low-frequency magnetic fields in the existing pulsed magnetic sensors based on solid-state spin. The present application has the following beneficial effects:

wide dynamic range; the measurement apparatus described in the embodiments of the present application adopts a continuous-wave type measurement method to measure the system in an equilibrium state, the measurement is a steady state measurement, which, compared with the conventional pulsed measurement method, is not limited by the relaxation time of the system, can greatly increase the measurement range of the magnetic field, and has a wider dynamic range;

high bandwidth; the measurement apparatus described in the embodiments of the present application adopts the continuous-wave type measurement method to measure the system in the equilibrium state, the measurement is a steady state measurement, which is not limited by the relaxation time of the system, so there is no lower frequency limit of the measurement, that is, the measurement apparatus can measure DC signals; the upper frequency limit of the measurement is determined by the intensity of manipulation such as continuous excitation, and a higher upper frequency limit can be reached by changing the intensity of manipulation; therefore, the measurement apparatus has a very high bandwidth, and can solve the problem of the inability to measure low-frequency magnetic fields in the existing pulsed magnetic sensors based on solid-state spin. As shown in FIG. 2, FIG. 2 is a curve chart of a measurement bandwidth of the magnetic field measurement apparatus according to an embodiment of the present application. As can be seen from FIG. 2, in the experiments, the curve of the bandwidth is controlled by changing the laser intensity. By adjusting the laser power, the bandwidth may reach higher than 100 kHz, and the measurement apparatus also makes up for the deficiency of the pulsed magnetic sensor that cannot measure low frequency magnetic fields.

high frequency resolution; since the obtained measurable fluorescence signal contains all the information of the magnetic field to be measured, a magnetic field measurement apparatus with a high frequency resolution can achieve a very high frequency resolution.

simple structure; the apparatus does not require additional hardware such as a pulse generator.

Based on the magnetic field measurement apparatus described in the above embodiments, a magnetic field measurement method based on solid-state spin is further provided according to another embodiment of the present application, which is applied to the magnetic field measurement apparatus described in the above embodiments. The magnetic field measurement method is as shown in FIG. 3. FIG. 3 is a schematic flowchart of the magnetic field measurement method according to an embodiment of the present application. The magnetic field measurement method includes the following steps S11 to S14.

Step S11 is that providing a static magnetic field of a set intensity for the measuring component 4 by the static magnetic field module 103 so that the magneto-sensitive unit undergoes Zeeman splitting.

Step S12 is that operating the manipulating module 102 and the light source 101 to provide a manipulating field and a manipulating laser for the measuring component 4, and continuously exciting and manipulating the magneto-sensitive unit.

The manipulating field allows the magneto-sensitive unit to transition between spin energy levels, the manipulating laser allows the magneto-sensitive unit to transition between the ground state and the excited state, and the fluorescence signal of which the intensity is related to the spin population of the system is emitted after the spin system reaches an equilibrium state under the joint action of the manipulating field and the manipulating laser.

The manipulating laser is a laser with a wavelength of 532 nm. The applied manipulating field is a microwave field, which allows the electrons of the NV color center to transition between the state $m_s=0$ and the state $m_s=\pm 1$. The applied manipulating laser allows the electrons in the NV color center to transition between the ground state and the excited state. Under the joint action of the manipulating laser and the manipulating field, the spin system reaches an equilibrium state, and emits a fluorescence signal of which the intensity is related to the spin population of the system.

Step S13 is that placing the measuring component 4 in the magnetic field to be measured, keeping the manipulating field, the manipulating laser, and the static magnetic field unchanged, and causing the magneto-sensitive unit to emit a fluorescence signal in another equilibrium state.

A Zeeman splitting energy-level difference of the magneto-sensitive unit is changed under the action of the magnetic field to be measured, and under the action of the manipulating field and the manipulating laser, the spin system reaches another equilibrium state, the spin population of the system is changed, the emitted fluorescence signal is changed, and the changed fluorescence signal contains measurement parameters of the magnetic field to be measured. The measurement parameters include a magnetic induction and a frequency of the magnetic field to be measured.

Step S14 is that converting the changed fluorescence signal into an electric signal by the detection module 104, and measuring the magnetic field to be measured based on the electric signal.

The signal receiving-conversion unit 6 acquires the above-mentioned fluorescence signal containing the measurement parameters of the magnetic field to be measured through the lens 5, converts the fluorescence signal into an electrical signal that is easy to directly measure by the measuring unit 7, and transmits the electric signal to the measuring unit 7. The measuring unit 7 acquires the electric signal transmitted from the receiving-conversion unit 6, and calculates information such as the intensity and the frequency of the magnetic field to be measured through data processing, so as to realize the measurement of the magnetic field to be measured. According to requirements, the measuring unit 7 may be an oscilloscope, and the magnetic field to be measured is measured in the time domain by the oscilloscope, or the measuring unit is a lock-in amplifier or a spectrum analyzer, and the magnetic field to be measured is measured in the frequency domain by the lock-in amplifier or the spectrum analyzer.

In the embodiment of the present application, a lock-in amplifier is used as the measurement unit 7. By scanning the modulation frequency of the lock-in amplifier, a frequency spectrum can be obtained, and the electrical signal is thereby measured in the frequency domain. The frequency and the magnetic induction of the magnetic field to be measured can be obtained by analyzing the frequency spectrum.

In the present specification, the embodiments are described in a progressive manner. Each embodiment mainly focuses on an aspect different from other embodiments, and reference can be made to these same or similar parts among the embodiments. As for the magnetic field measurement method disclosed in the embodiments, since it corresponds to the magnetic field measurement apparatus disclosed in the embodiments, the description is relatively simple. For the relevant part, reference can be made to the description of the corresponding part of the magnetic field measurement apparatus.

Based on the above description of the disclosed embodiments, those skilled in the art are capable of implementing or using the present application. Various changes to these embodiments are apparent for those skilled in the art, and general principles defined herein may be implemented in other embodiments without departing from the spirit or scope of the present application. Therefore, the present application is not limited to the embodiments disclosed herein, but conforms to the widest scope in accordance with the principles and novel features disclosed herein.

The invention claimed is:

1. A magnetic field measurement apparatus based on solid-state spin, comprising:
   a measuring component, which comprises a magneto-sensitive unit based on solid-state spin;
   a light source module, which is configured to emit a manipulating laser that irradiates the measuring component;
   a manipulating module, which is configured to provide a manipulating field for the measuring component;
   a static magnetic field module, which is configured to provide a set static magnetic field for the measuring component; and
   a detection module, which is configured to acquire a fluorescence signal emitted by the measuring component under actions of a magnetic field to be measured, the manipulating laser, the manipulating field, and the static magnetic field, and measure the magnetic field to be measured based on the fluorescence signal,
   wherein a static magnetic field of a set intensity is provided for the measuring component by the static magnetic field module so that the magneto-sensitive unit undergoes Zeeman splitting;

the manipulating field allows the magneto-sensitive unit to transition between spin energy levels, the manipulating laser allows the magneto-sensitive unit to transition between the ground state and the excited state, and the fluorescence signal of which the intensity is related to the spin population of the system is emitted after the spin system reaches an equilibrium state under the joint action of the manipulating field and the manipulating laser;

the manipulating field, the manipulating laser, and the static magnetic field are kept unchanged, a Zeeman splitting energy-level difference of the magneto-sensitive unit is changed under the action of the magnetic field to be measured, and under the action of the manipulating field and the manipulating laser, the spin system reaches another equilibrium state, the spin population of the system is changed, the intensity of the emitted fluorescence signal is changed, the changed fluorescence signal contains measurement parameters of the magnetic field to be measured;

the changed fluorescence signal is converted into an electric signal by the detection module, and the magnetic field to be measured is measured based on the electric signal.

2. The magnetic field measurement apparatus according to claim 1, wherein the measuring component is a diamond block having an NV color center, and the NV color center is the magneto-sensitive unit.

3. The magnetic field measurement apparatus according to claim 1, wherein the light source module comprises a light source and an optical unit, and an optical signal emitted by the light source is processed by the optical unit to form the manipulating laser.

4. The magnetic field measurement apparatus according to claim 3, wherein the light source is a laser device, and a wavelength of the laser emitted by the laser device is 532 nm; and the optical unit is configured to collimate and focus the laser emitted by the laser device to form the manipulating laser, and configured to allow the manipulating laser to irradiate a preset position of the measuring component.

5. The magnetic field measurement apparatus according to claim 1, wherein the manipulating module comprises a manipulating source and a microstrip antenna connected to the manipulating source; and the manipulating source is configured to drive the microstrip antenna to form the manipulating field.

6. The magnetic field measurement apparatus according to claim 5, wherein the manipulating source is a microwave source configured to allow the microstrip antenna to form a microwave field, and the microwave field is the manipulating field.

7. The magnetic field measurement apparatus according to claim 1, wherein the static magnetic field module comprises a static magnetic field device and a power source; and the power source is configured to drive the static magnetic field device to form the static magnetic field.

8. The magnetic field measurement apparatus according to claim 7, wherein the static magnetic field device is a static magnetic field coil.

9. The magnetic field measurement apparatus according to claim 1, wherein the detection module comprises a signal receiving-conversion unit and a measuring unit; and when the magnetic field to be measured is measured, the fluorescence signal emitted by the magneto-sensitive unit enters the signal receiving-conversion unit, and the signal receiving-conversion unit is configured to convert the fluorescence signal into an electric signal; and the measuring unit is configured to measure the magnetic field to be measured based on the electrical signal.

10. A magnetic field measurement method based on solid-state spin applied to the magnetic field measurement apparatus according to claim 1, comprising:

providing a static magnetic field of a set intensity for the measuring component by the static magnetic field module, wherein the magneto-sensitive unit undergoes Zeeman splitting;

operating the manipulating module and the light source module to provide a manipulating field and a manipulating laser for the measuring component, and continuously exciting and manipulating the magneto-sensitive unit, wherein the manipulating field allows the magneto-sensitive unit to transition between spin energy levels, the manipulating laser allows the magneto-sensitive unit to transition between a ground state and an excited state, and a fluorescence signal of which the intensity is related to spin population of the spin system is emitted after the spin system reaches an equilibrium state under an joint action of the manipulating field and the manipulating laser;

placing the measuring component in a magnetic field to be measured, and keeping the manipulating field, the manipulating laser, and the static magnetic field unchanged, wherein a Zeeman splitting energy-level difference of the magneto-sensitive unit is changed under an action of the magnetic field to be measured, and under actions of the manipulating field and the manipulating laser, the spin system reaches another equilibrium state, the spin population of the system is changed, the emitted fluorescence signal is changed, and the changed fluorescence signal contains measurement parameters of the magnetic field to be measured; and converting the changed fluorescence signal into an electric signal by the detection module, and measuring the magnetic field to be measured based on the electric signal.

11. A magnetic field measurement method based on solid-state spin applied to the magnetic field measurement apparatus according to claim 2, comprising:

providing a static magnetic field of a set intensity for the measuring component by the static magnetic field module, wherein the magneto-sensitive unit undergoes Zeeman splitting;

operating the manipulating module and the light source module to provide a manipulating field and a manipulating laser for the measuring component, and continuously exciting and manipulating the magneto-sensitive unit, wherein the manipulating field allows the magneto-sensitive unit to transition between spin energy levels, the manipulating laser allows the magneto-sensitive unit to transition between a ground state and an excited state, and a fluorescence signal of which the intensity is related to spin population of the spin system is emitted after the spin system reaches an equilibrium state under an joint action of the manipulating field and the manipulating laser;

placing the measuring component in a magnetic field to be measured, and keeping the manipulating field, the manipulating laser, and the static magnetic field unchanged, wherein a Zeeman splitting energy-level difference of the magneto-sensitive unit is changed under an action of the magnetic field to be measured, and under actions of the manipulating field and the manipulating laser, the spin system reaches another equilibrium state, the spin population of the system is changed, the emitted fluorescence signal is changed, and the changed fluorescence signal contains measurement parameters of the magnetic field to be measured; and converting the changed fluorescence signal into an electric signal by the detection module, and measuring the magnetic field to be measured based on the electric signal.

12. A magnetic field measurement method based on solid-state spin applied to the magnetic field measurement apparatus according to claim 3, comprising:

providing a static magnetic field of a set intensity for the measuring component by the static magnetic field module, wherein the magneto-sensitive unit undergoes Zeeman splitting;

operating the manipulating module and the light source module to provide a manipulating field and a manipulating laser for the measuring component, and continuously exciting and manipulating the magneto-sensitive unit, wherein the manipulating field allows the magneto-sensitive unit to transition between spin energy levels, the manipulating laser allows the magneto-sensitive unit to transition between a ground state and an excited state, and a fluorescence signal of which the intensity is related to spin population of the spin system is emitted after the spin system reaches an equilibrium state under an joint action of the manipulating field and the manipulating laser;

placing the measuring component in a magnetic field to be measured, and keeping the manipulating field, the manipulating laser, and the static magnetic field unchanged, wherein a Zeeman splitting energy-level difference of the magneto-sensitive unit is changed under an action of the magnetic field to be measured, and under actions of the manipulating field and the manipulating laser, the spin system reaches another equilibrium state, the spin population of the system is changed, the emitted fluorescence signal is changed, and the changed fluorescence signal contains measurement parameters of the magnetic field to be measured; and converting the changed fluorescence signal into an electric signal by the detection module, and measuring the magnetic field to be measured based on the electric signal.

13. A magnetic field measurement method based on solid-state spin applied to the magnetic field measurement apparatus according to claim 4, comprising:

providing a static magnetic field of a set intensity for the measuring component by the static magnetic field module, wherein the magneto-sensitive unit undergoes Zeeman splitting;

operating the manipulating module and the light source module to provide a manipulating field and a manipulating laser for the measuring component, and continuously exciting and manipulating the magneto-sensitive unit, wherein the manipulating field allows the magneto-sensitive unit to transition between spin energy levels, the manipulating laser allows the magneto-sensitive unit to transition between a ground state and an excited state, and a fluorescence signal of which the intensity is related to spin population of the spin system is emitted after the spin system reaches an equilibrium state under an joint action of the manipulating field and the manipulating laser;

placing the measuring component in a magnetic field to be measured, and keeping the manipulating field, the manipulating laser, and the static magnetic field unchanged, wherein a Zeeman splitting energy-level difference of the magneto-sensitive unit is changed under an action of the magnetic field to be measured, and under actions of the manipulating field and the manipulating laser, the spin system reaches another equilibrium state, the spin population of the system is changed, the emitted fluorescence signal is changed, and the changed fluorescence signal contains measurement parameters of the magnetic field to be measured; and converting the changed fluorescence signal into an electric signal by the detection module, and measuring the magnetic field to be measured based on the electric signal.

14. A magnetic field measurement method based on solid-state spin applied to the magnetic field measurement apparatus according to claim 5, comprising:

providing a static magnetic field of a set intensity for the measuring component by the static magnetic field module, wherein the magneto-sensitive unit undergoes Zeeman splitting;

operating the manipulating module and the light source module to provide a manipulating field and a manipulating laser for the measuring component, and continuously exciting and manipulating the magneto-sensitive unit, wherein the manipulating field allows the magneto-sensitive unit to transition between spin energy levels, the manipulating laser allows the magneto-sensitive unit to transition between a ground state and an excited state, and a fluorescence signal of which the intensity is related to spin population of the spin system is emitted after the spin system reaches an equilibrium state under an joint action of the manipulating field and the manipulating laser;

placing the measuring component in a magnetic field to be measured, and keeping the manipulating field, the manipulating laser, and the static magnetic field unchanged, wherein a Zeeman splitting energy-level difference of the magneto-sensitive unit is changed under an action of the magnetic field to be measured, and under actions of the manipulating field and the manipulating laser, the spin system reaches another equilibrium state, the spin population of the system is changed, the emitted fluorescence signal is changed, and the changed fluorescence signal contains measurement parameters of the magnetic field to be measured; and converting the changed fluorescence signal into an electric signal by the detection module, and measuring the magnetic field to be measured based on the electric signal.

15. A magnetic field measurement method based on solid-state spin applied to the magnetic field measurement apparatus according to claim 6, comprising:

providing a static magnetic field of a set intensity for the measuring component by the static magnetic field module, wherein the magneto-sensitive unit undergoes Zeeman splitting;

operating the manipulating module and the light source module to provide a manipulating field and a manipulating laser for the measuring component, and continuously exciting and manipulating the magneto-sensitive unit, wherein the manipulating field allows the magneto-sensitive unit to transition between spin energy levels, the manipulating laser allows the magneto-sensitive unit to transition between a ground state and an excited state, and a fluorescence signal of which the intensity is related to spin population of the spin system is emitted after the spin system reaches an equilibrium state under an joint action of the manipulating field and the manipulating laser;

placing the measuring component in a magnetic field to be measured, and keeping the manipulating field, the manipulating laser, and the static magnetic field unchanged, wherein a Zeeman splitting energy-level difference of the magneto-sensitive unit is changed under an action of the magnetic field to be measured, and under actions of the manipulating field and the manipulating laser, the spin system reaches another equilibrium state, the spin population of the system is changed, the emitted fluorescence signal is changed, and the changed fluorescence signal contains measurement parameters of the magnetic field to be measured; and converting the changed fluorescence signal into an electric signal by the detection module, and measuring the magnetic field to be measured based on the electric signal.

16. A magnetic field measurement method based on solid-state spin applied to the magnetic field measurement apparatus according to claim 7, comprising:

providing a static magnetic field of a set intensity for the measuring component by the static magnetic field module, wherein the magneto-sensitive unit undergoes Zeeman splitting;

operating the manipulating module and the light source module to provide a manipulating field and a manipulating laser for the measuring component, and continuously exciting and manipulating the magneto-sensitive unit, wherein the manipulating field allows the magneto-sensitive unit to transition between spin energy levels, the manipulating laser allows the magneto-sensitive unit to transition between a ground state and an excited state, and a fluorescence signal of which the intensity is related to spin population of the spin system is emitted after the spin system reaches an equilibrium state under an joint action of the manipulating field and the manipulating laser;

placing the measuring component in a magnetic field to be measured, and keeping the manipulating field, the manipulating laser, and the static magnetic field unchanged, wherein a Zeeman splitting energy-level difference of the magneto-sensitive unit is changed under an action of the magnetic field to be measured, and under actions of the manipulating field and the manipulating laser, the spin system reaches another equilibrium state, the spin population of the system is changed, the emitted fluorescence signal is changed, and the changed fluorescence signal contains measurement parameters of the magnetic field to be measured; and converting the changed fluorescence signal into an electric signal by the detection module, and measuring the magnetic field to be measured based on the electric signal.

17. A magnetic field measurement method based on solid-state spin applied to the magnetic field measurement apparatus according to claim 8, comprising:

providing a static magnetic field of a set intensity for the measuring component by the static magnetic field module, wherein the magneto-sensitive unit undergoes Zeeman splitting;

operating the manipulating module and the light source module to provide a manipulating field and a manipulating laser for the measuring component, and continuously exciting and manipulating the magneto-sensitive unit, wherein the manipulating field allows the magneto-sensitive unit to transition between spin energy levels, the manipulating laser allows the magneto-sensitive unit to transition between a ground state and an excited state, and a fluorescence signal of which the intensity is related to spin population of the spin system is emitted after the spin system reaches an equilibrium state under an joint action of the manipulating field and the manipulating laser;

placing the measuring component in a magnetic field to be measured, and keeping the manipulating field, the manipulating laser, and the static magnetic field unchanged, wherein a Zeeman splitting energy-level difference of the magneto-sensitive unit is changed under an action of the magnetic field to be measured, and under actions of the manipulating field and the manipulating laser, the spin system reaches another equilibrium state, the spin population of the system is changed, the emitted fluorescence signal is changed, and the changed fluorescence signal contains measurement parameters of the magnetic field to be measured; and converting the changed fluorescence signal into an electric signal by the detection module, and measuring the magnetic field to be measured based on the electric signal.

18. A magnetic field measurement method based on solid-state spin applied to the magnetic field measurement apparatus according to claim 9, comprising:

providing a static magnetic field of a set intensity for the measuring component by the static magnetic field module, wherein the magneto-sensitive unit undergoes Zeeman splitting;

operating the manipulating module and the light source module to provide a manipulating field and a manipulating laser for the measuring component, and continuously exciting and manipulating the magneto-sensitive unit, wherein the manipulating field allows the magneto-sensitive unit to transition between spin energy levels, the manipulating laser allows the magneto-sensitive unit to transition between a ground state and an excited state, and a fluorescence signal of which the intensity is related to spin population of the spin system is emitted after the spin system reaches an equilibrium state under an joint action of the manipulating field and the manipulating laser;

placing the measuring component in a magnetic field to be measured, and keeping the manipulating field, the manipulating laser, and the static magnetic field unchanged, wherein a Zeeman splitting energy-level difference of the magneto-sensitive unit is changed under an action of the magnetic field to be measured, and under actions of the manipulating field and the manipulating laser, the spin system reaches another equilibrium state, the spin population of the system is changed, the emitted fluorescence signal is changed, and the changed fluorescence signal contains measurement parameters of the magnetic field to be measured; and converting the changed fluorescence signal into an electric signal by the detection module, and measuring the magnetic field to be measured based on the electric signal.

\* \* \* \* \*